(12) United States Patent
Sun et al.

(10) Patent No.: US 11,145,691 B2
(45) Date of Patent: Oct. 12, 2021

(54) ORGANIC LIGHT-EMITTING DISPLAY PANEL AND DISPLAY DEVICE

(71) Applicant: Shanghai Tianma AM-OLED Co., Ltd., Shanghai (CN)

(72) Inventors: Xiaoqian Sun, Shanghai (CN); Xiangcheng Wang, Shanghai (CN); Jinghua Niu, Shanghai (CN); Weili Qiao, Shanghai (CN); Jun Lin, Shanghai (CN); Lei Wen, Shanghai (CN); Ping An, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 121 days.

(21) Appl. No.: 16/210,281

(22) Filed: Dec. 5, 2018

(65) Prior Publication Data

US 2020/0006439 A1   Jan. 2, 2020

(30) Foreign Application Priority Data

Jun. 29, 2018 (CN) .......................... 201810694344.5

(51) Int. Cl.
  *H01L 27/32* (2006.01)
  *H01L 51/50* (2006.01)
  *H01L 51/52* (2006.01)

(52) U.S. Cl.
  CPC ........ *H01L 27/3211* (2013.01); *H01L 51/508* (2013.01); *H01L 51/5064* (2013.01); *H01L 51/5275* (2013.01)

(58) Field of Classification Search
  CPC .............. H01L 27/3211; H01L 51/5064; H01L 51/508; H01L 51/5275; H01L 51/5036; H01L 51/504
  See application file for complete search history.

(56) References Cited

U.S. PATENT DOCUMENTS 6,472,817 B1 * 10/2002 Kawase ............. G02B 6/12004
                                                   257/E27.119
8,680,542 B2 *  3/2014 Kurata ................ H01L 51/5265
                                                   257/88
(Continued)

FOREIGN PATENT DOCUMENTS

CN          101030621 A      9/2007
CN          102694125 A  *   9/2012
(Continued)

OTHER PUBLICATIONS

Jaglarz et al. "Ellipsometric studies of carbazole-containing polymer layers" in Optical Materials vol. 29, p. 908. Published by Elsevier in 2007. (Year: 2007).*

(Continued)

*Primary Examiner* — Tuan A Hoang
(74) *Attorney, Agent, or Firm* — Tarolli, Sundheim, Covell & Tummino LLP

(57) ABSTRACT

Provided are an organic light-emitting display panel and a display device, for improving the light extraction efficiency of OLED display panel. The organic light-emitting display panel includes an array substrate having a plurality of driving elements, and a plurality of organic light-emitting components. Each light-emitting component includes an anode, a cathode and an organic functional layer arranged between the anode and the cathode. The organic functional layer includes a hole transmission region, a light-emitting layer, and an electron transmission region stacked in a sequence from the anode to the cathode. With respect to visible light having a certain wavelength, a refractive index of the light-emitting layer is less than a refractive index of the electron transmission region, and the refractive index of the light-emitting layer is less than a refractive index of the (Continued)

hole transmission region. The above organic light-emitting display panel is applicable to the display device.

12 Claims, 7 Drawing Sheets

(56) References Cited

U.S. PATENT DOCUMENTS

| | | | | |
|---|---|---|---|---|
| 8,808,876 B2* | 8/2014 | Takasu | ............... | C09K 11/06 428/690 |
| 2004/0160171 A1* | 8/2004 | Takahashi | ......... | H01L 51/5262 313/504 |
| 2005/0127360 A1* | 6/2005 | Uchida | ............ | H01L 51/5012 257/59 |
| 2012/0268042 A1* | 10/2012 | Shiobara | ......... | H01L 51/5284 315/312 |
| 2012/0286294 A1* | 11/2012 | Ishizuya | ......... | H01L 51/5275 257/80 |
| 2018/0114937 A1* | 4/2018 | Ito | ................... | H01L 51/5275 |
| 2018/0301521 A1* | 10/2018 | Yang | ............... | H01L 27/3211 |

FOREIGN PATENT DOCUMENTS

| | | | |
|---|---|---|---|
| CN | 102694125 A | | 9/2012 |
| CN | 102751447 A | * | 10/2012 |
| CN | 102751447 A | | 10/2012 |
| CN | 102779946 A | | 11/2012 |
| CN | 106876331 A | | 6/2017 |
| GN | 102440073 A | | 5/2012 |

OTHER PUBLICATIONS

Wang et al. "Calculation of Optical Parameter of MEH-PPV Film" in Acta Photonica Sinica vol. 34. No. 5, May 2005. Published by the Chinese Optical Society in 2005. (Year: 2005).*
Pei, "Light-Emitting Polymers" in Material Matters vol. 2.3, p. 26. Published by Merck in 2007. (Year: 2007).*
Chinese Office Action dated Mar. 2, 2020 for corresponding CN Application No. 201810694344.5, and English translation thereof.
Chinese Office Action dated Oct. 14, 2020 and English translation thereof for corresponding Chinese Application No. 201810694344.5.

* cited by examiner

… (1) …

ORGANIC LIGHT-EMITTING DISPLAY PANEL AND DISPLAY DEVICE

CROSS-REFERENCE TO RELATED APPLICATIONS

The present application claims the benefit of priority to Chinese Patent Application No. 201810694344.5, filed on Jun. 29, 2018, the content of which is incorporated herein by reference in its entirety.

TECHNICAL FIELD

The present disclosure relates to the field of display, and particularly, to an organic light-emitting display panel and a display device.

BACKGROUND

An OLED (Organic Light-Emitting Diode) display panel, compared with many other display panels, has many advantages such as active light-emitting, high contrast, and unlimited viewing angle. The OLED display panel is not only thinner and lighter, but also requires lower power consumption than other display devices, thereby contributing to improving the endurance of display apparatuses. Therefore, the OLED display panel is widely used in the field of display technology, and will become a dominated display device in the future.

One of the most important parameters of the OLED display panel is luminous efficiency. Therefore, an urgent problem to be solved in the field is how to improve the light-emitting efficiency of the OLED display panel and thus to improve light extraction efficiency.

SUMMARY

In view of the above, embodiments of the present disclosure provide an organic light-emitting display panel and a display device, for improving the light extraction efficiency of OLED display panel.

In a first aspect, the present disclosure provides an organic light-emitting display panel. The organic light-emitting display panel includes: an array substrate, the array substrate including a plurality of driving elements; and a plurality of organic light-emitting components corresponding to the plurality of driving elements. Each of the plurality of light-emitting components includes an anode, a cathode and an organic functional layer arranged between the anode and the cathode. The organic functional layer includes a hole transmission region, a light-emitting layer, and an electron transmission region stacked in a sequence from the anode to the cathode. With respect to visible light having a certain wavelength, a refractive index of the light-emitting layer is less than a refractive index of the electron transmission region, and the refractive index of the light-emitting layer is less than a refractive index of the hole transmission region.

In a second aspect, the present disclosure provides an organic light-emitting display device, including the organic light-emitting display panel according to the first aspect of the present disclosure.

BRIEF DESCRIPTION OF DRAWINGS

In order to clearly illustrate technical solutions of embodiments of the present disclosure or the related art, the accompanying drawings used in the embodiments or the related art are introduced hereinafter. These drawings merely illustrate some embodiments of the present disclosure. On the basis of these drawings, those skilled in the art can also obtain other drawings without paying any creative effort.

DESCRIPTION OF EMBODIMENTS

Figure 1:
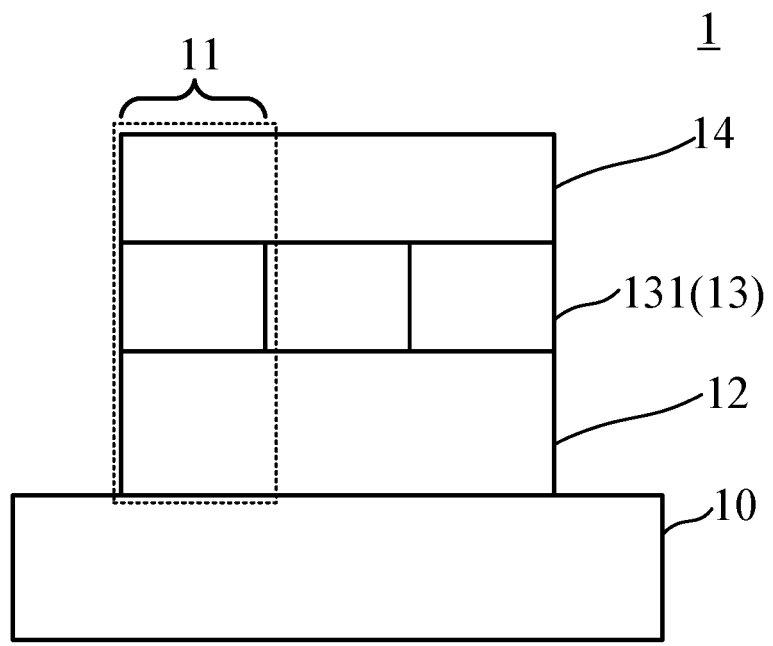
FIG. 1 is a schematic structural diagram of an organic light-emitting display panel according to an embodiment of the present disclosure.

In order to clarify the objects, technical solutions and advantages of the present disclosure, the technical solutions in the embodiments of the present disclosure will be clearly and completely described with reference to the accompanying drawings. Obviously, the described embodiments are only a part of the embodiments, rather than all of them. Based on the embodiments of the present disclosure, any other embodiments obtained by those skilled in the art shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represent: (a) A exists alone; (b) A and B exist at the same time; or (c) B exists alone. In addition, the character "/" generally indicates "or".

It should be understood that, although expressions "first", "second", "third" etc. are used to describe hole transmission layers, they shall not be interpreted as limiting the hole transmission layers. These expressions are merely used to distinguish among the hole transmission layers. For example, without departing from the scope of the present disclosure, a first hole transmission layer also can be referred as a second hole transmission layer, and vice versa.

It should be noted that, the terms such as "on", "under", "left", "right" are used to describe orientations and locations in a viewing angel shown in the drawings, which shall not be interpreted as limitations of the present disclosure. In addition, in the context, it should be noted that, when an element is formed "on" or "under" another element, the element can be directly formed "on" or "under" the other element, or can be indirectly formed "above" or "below" the other element through an intervening element.

Before describing the embodiments of the present disclosure in detail, a structure of a related organic light-emitting display panel and the concept of the present disclosure will be briefly introduced as follows.

FIG. 1 is a schematic structural diagram of an organic light-emitting display panel according to an embodiment of the present disclosure. The organic light-emitting display panel 1 includes an array substrate 10, and the array substrate 10 includes a plurality of driving elements (not shown). The organic light-emitting display panel 1 further includes a plurality of organic light-emitting components 11 corresponding to the plurality of driving elements. Each light-emitting component 11 includes an anode 12, a cathode 14 and an organic functional layer 13 arranged between the anode 12 and the cathode 14.

It should be understood that, the anode 12 is in contact with a side of the array substrate 10, and the cathode 14 is located on a side of the organic functional layer 13 facing away from the array substrate 10.

The array substrate 10 in the present embodiment can be a flexible substrate, and the corresponding organic light-emitting display panel 1 also can be a flexible organic light-emitting display panel. Since the flexible organic light-emitting display panel has special characteristics such as low power consumption, bendability and the like, it is applicable to diverse kinds of display devices, especially to a wearable display device. In an embodiment, the flexible substrate is made of polyester imide or polyethylene terephthalate resin. In addition, the array substrate 10 can also be a rigid substrate, and correspondingly, the organic light-emitting display panel 1 can be a rigid organic light-emitting display panel. In fact, the present disclosure does not specifically limit the material of the organic light-emitting display panel.

In the present embodiment, during an electroluminescence process, the anode 12 is applied with a positive voltage. In the present embodiment, the anode 12 can be made of indium tin oxide. Specifically, the anode 12 at least includes a reflective film located on a side of the anode 12 facing away from the array substrate 10, and the reflective film can be made of silver. The anode 12 can further include a transparent conductive thin film located on a side of the reflective film facing away from the array substrate 10, and the transparent conductive thin film can be made of indium tin oxide or indium zinc oxide.

In the present embodiment, during the electroluminescence process, the cathode 14 is applied with a negative voltage. In order to improve the capacity of injecting the electron carriers from the cathode 14 into the organic functional layer 13, the cathode 14 can be made of a metal material or a composite metal material having low work function, such as Ag, Al, Ca, In, Li, Mg and the like.

Figure 2:
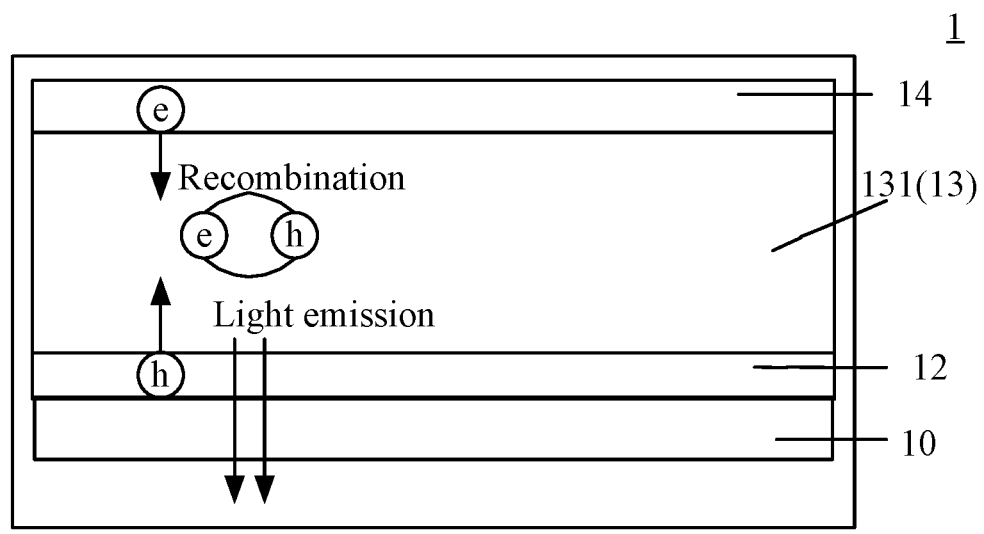
FIG. 2 is a schematic diagram of a principle of an organic light-emitting display panel according to an embodiment of the present disclosure.

FIG. 2 is a schematic diagram of a principle of an organic light-emitting display panel according to an embodiment of the present disclosure. Under an applied electric field, electrons e are injected from the cathode 14 into the organic functional layer 13, and the holes h are injected from the anode 12 to the organic functional layer 13. The injected electrons e and the injected holes h generate excitons after the organic light-emitting layer 131 is recombined. The excitons migrate under the effect of the electric field, and transmit energy to organic light-emitting molecules in the organic light-emitting layer 131. The electrons of the organic light-emitting molecules jump from a ground state to an excited state and release energy. Finally, the energy is released in a form of photons to emit light.

In the OLED panel, the light-emitting layer is composed of a host material and a dopant material, and the light-emitting efficiency depends on a concentration of the dopant material. Therefore, the light-emitting property of the light-emitting layer is enhanced mainly by modifying or adjusting the organic molecular structure of the light-emitting layer itself. The development cycle of improving the material is much longer, and it is unlikely to obtain any result in a short time.

In order to improve the light-emitting efficiency of the OLED display panel, the present disclosure provides following technical solutions.

Figure 3:
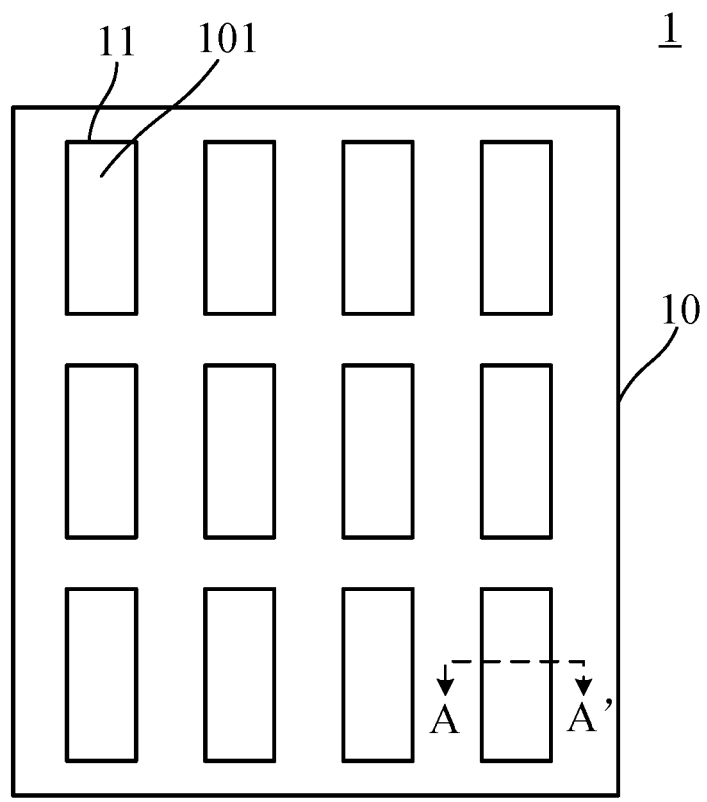
FIG. 3 is another schematic structural diagram of an organic light-emitting display panel according to an embodiment of the present disclosure.
Figure 4:
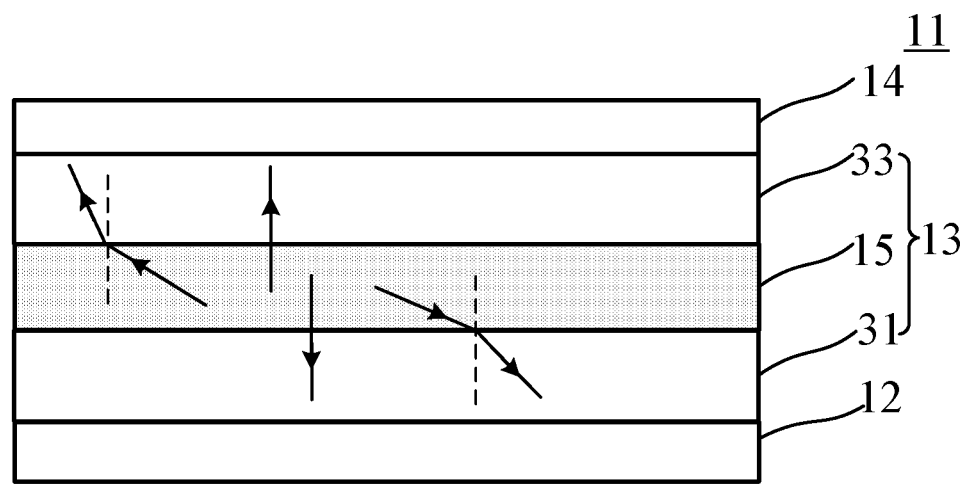
FIG. 4 is a cross-sectional view of an organic light-emitting component according to an embodiment of the present disclosure along AA' line in FIG. 3.

The present disclosure provides an organic light-emitting display panel, as shown in FIG. 3 and FIG. 4, where FIG. 3 is another schematic structural diagram of an organic light-emitting display panel according to an embodiment of the present disclosure, and FIG. 4 is a cross-sectional view of an organic light-emitting component according to an embodiment of the present disclosure along AA' line in FIG. 3. As shown in FIG. 3, the organic light-emitting display panel 1 includes an array substrate 10, and the array substrate 10 includes a plurality of driving elements 101. In order to illustrate a relationship between the driving elements 101 and the organic light-emitting components 11, the organic light-emitting components 11 in FIG. 3 are set to have a transparency of 60%, so that the driving elements 101 covered by the organic light-emitting components are visible.

It should be noted that the organic light-emitting display panel 1 in this embodiment can be a top emission structure or a bottom emission structure, which is not specifically limited in the present embodiment. Exemplarily, FIG. 4 and subsequent figures illustrate a top emission structure, so as to help those skilled in the art to understand the technical solution.

As shown in FIG. 4, the organic light-emitting display panel 1 further includes an organic light-emitting component 11 corresponding to a driving element 101. The organic light-emitting component 11 includes an anode 12, a cathode 14 and an organic functional layer 13 disposed between the anode 12 and the cathode 14. The organic functional layer 13 includes a hole transmission region 31, a light-emitting layer 15, and an electron transmission region 33 sequentially stacked from the anode 12 to the cathode 14.

With respect to visible light having a certain wavelength, a refractive index of the light-emitting layer 15 is less than a refractive index of the electron transmission region 33. As shown in FIG. 4, a part of the light generated by the light-emitting layer 15 is emitted upwardly in a direction perpendicular to the cathode 14, and another part of the light emitted obliquely upward is refracted at an interface between the light-emitting layer 15 and the electron transmission region 33 due to the greater refractive index of the electron transmission region 33 closer to the cathode 14 than the refractive index of the light-emitting layer 15. That is, light gets into an optically denser medium from an optically thinner medium, so that the light getting into the electron transmission region 33 is emitted close to the normal direction, thereby increasing the amount of the emitted light and further improving the light extraction efficiency.

In addition, with respect to a visible light having a certain wavelength, the refractive index of the light-emitting layer 15 is less than a refractive index of the hole transmission region 31. As shown in FIG. 4, a part of the light generated by the light-emitting layer 15 is emitted downwardly in a direction perpendicular to the cathode 14, and another part of the light emitted obliquely downward is refracted at an interface between the light-emitting layer 15 and the hole transmission region 31 due to the greater refractive index of the hole transmission region 31 away from the cathode 14 than the refractive index of the light-emitting layer 15. That is, light gets into an optically denser medium from an optically thinner medium, so that the light getting into the hole transmission region 33 is emitted close to the normal direction. In this way, light can be prevented from getting into a region outside the organic light-emitting component 11, which would otherwise result in that the light cannot be extracted. Further, the emitted light is totally reflected through the anode 12 in a small angle, which is conductive to improving the light extraction efficiency.

Compared with the related art, in the embodiment of the present disclosure, on the one hand, the obliquely upward light is close to the normal direction and is emitted in a small angle, so as to improve the light extraction efficiency; on the other hand, the obliquely downward light changes its incidence path to be emitted from the anode in a small angle, so that the light is emitted upwardly close to the normal line. Therefore, in the present embodiment, the total amount of the emitted light is increased compared with the prior art, thereby improving the light extraction efficiency.

Further, with respect to the visible light having a wavelength of 460 nm, the refractive index n1 ($\lambda$=460 nm) of the light-emitting layer 15 satisfies: 1.45$\leq$n1 ($\lambda$=460 nm)$\leq$1.6.

In combination with the above embodiment, on the one hand, the refractive index n1 of the light-emitting layer 15 is less than the refractive index of the electron transmission region 33, and is also less than the refractive index of the hole transmission region 31. That is, the refractive index of the light-emitting layer 15 is relatively small. On the other hand, when the light emitted from the light-emitting layer 15 is blue light, the material of the light-emitting layer 15 has a certain refractive index. Therefore, considering the material of the light-emitting layer and the relatively small refractive index of the light-emitting layer, the refractive index n1 of the light-emitting layer 15 of the present embodiment preferably satisfies 1.45$\leq$n1 ($\lambda$=460 nm)$\leq$1.6.

In an embodiment, with respect to the visible light having a wavelength of 460 nm, the refractive index n1 ($\lambda$=460 nm) of the light-emitting layer 15 and the refractive index n2 ($\lambda$=460 nm) of the electron transmission region 33 satisfy: n2($\lambda$=460 nm)−n1($\lambda$=460 nm)$\geq$0.1.

In the present embodiment, it has been found trough experiments that, with respect to the blue light having a wavelength $\lambda$=460 nm, if a difference between the refractive index n1 ($\lambda$=460 nm) of the light-emitting layer 15 and the refractive index n2 of the electron transmission region 33 ($\lambda$=460 nm) is greater than 0.1, the amount of light extraction is significantly increased, which is conductive to improving the light extraction efficiency. Moreover, the refractive index of the electron transmission region 33 is greater than the refractive index of the light-emitting layer 15, so that the light is emitted close to the normal line, thereby increasing the total amount of the emitted light, and further improving the light extraction efficiency.

The refractive index n1 ($\lambda$=460 nm) of the light-emitting layer 15 and the refractive index n3 ($\lambda$=460 nm) of the hole transmission region 31 satisfy: n3($\lambda$=460 nm)−n1($\lambda$=460 nm)$\geq$0.1.

Similarly, with respect to the blue light having a wavelength $\lambda$=460 nm, if a difference between the refractive index n1 ($\lambda$=460 nm) of the light-emitting layer 15 and the refractive index n3 ($\lambda$=460 nm) of the hole transmission region 31 is greater than 0.1, the total amount of light emitted from the cathode 14 is significantly increased, which is conductive to increasing the light extraction efficiency. Moreover, the refractive index of the hole transmission region 31 is greater than the refractive index of the light-emitting layer 15. Therefore, the light getting into the hole transmission region 31 is emitted close to the normal direction, so as to prevent the light from getting into the region outside the organic light-emitting component 11, which would otherwise result in that light cannot be extracted. Further, the emitted light is totally reflected by the anode 12 in a small angle, which is conductive to improving the light extraction efficiency.

In a specific embodiment, with respect to the visible light having a wavelength of 460 nm, the refractive index n2 ($\lambda$=460 nm) of the electron transmission region 33 satisfies: 1.6$\leq$n2($\lambda$=460 nm)$\leq$1.9.

In combination with the above embodiment, when the light is emitted in a direction from the light-emitting layer 15 to the cathode 14, with respect to the blue light having a wavelength of $\lambda$=460 nm, the difference between the refractive index of the light-emitting layer 15 and the refractive index of the electron transmission region 33 is greater than or equal to 0.1. However, after repeating the experiments for many times, it is found that, if the difference between the refractive index of the electron transmission region 33 and the refractive index of the light-emitting layer 15 is less than 0.15, the light extraction efficiency cannot be effectively improved. Therefore, in the present embodiment, the refractive index n2 of the electron transmission region 33 is set to satisfy: 1.6$\leq$n2 ($\lambda$=460 nm)$\leq$1.9.

In addition, the refractive index n3 ($\lambda$=460 nm) of the hole transmission region 31 satisfies: 1.6$\leq$n3($\lambda$=460 nm)$\leq$1.9.

Similarly, with respect to the blue light having a wavelength of $\lambda$=460 nm, the difference between the refractive index of the hole transmission region 31 and the refractive index of the light-emitting layer 15 is greater than or equal to 0.1. However, after repeating the experiments for many times, it is found that, if the difference between the refractive index of the hole transmission region 31 and the refractive index of the light-emitting layer 15 is less than 0.15, the light extraction efficiency cannot be effectively improved. Therefore, in the present embodiment, the refractive index n3 of the hole transmission region 31 is set to satisfy: 1.6$\leq$n3 ($\lambda$=460 nm)$\leq$1.9.

In combination with the above embodiment, since the refractive index of the light-emitting layer 15 is less than the refractive index of the electron transmission region 33 and the refractive index of the hole transmission region 31, the light is emitted from the light-emitting layer 15 in a small angle and thus closer to the normal lime.

In another specific embodiment, with respect to the blue light having a wavelength of $\lambda$=460 nm, the refractive index n2 ($\lambda$=460 nm) of the electron transmission region 33 satisfies: 1.8$\leq$n2($\lambda$=460 nm)$\leq$1.9.

The difference between the refractive index of the electron transmission region 33 and the refractive index of the light-emitting layer 15 is further increased on the basis of the refractive index of the light-emitting layer 15. However, after repeating the experiments for many times, it is found that the difference therebetween cannot be expanded unlimitedly. When the difference between the refractive index of the electron transmission region 33 and the refractive index of the light-emitting layer 15 is greater than 0.3, the light extraction efficiency cannot be effectively improved. Therefore, in the present embodiment, the refractive index n2 of the electron transmission region 33 is set to satisfy: 1.8≤n2 (λ=460 nm)≤1.9.

In addition, the refractive index n3 (λ=460 nm) of the hole transmission region 31 satisfies: 1.8≤n3(λ=460 nm)≤1.9.

Similarly, the difference between the refractive index of the hole transmission region 31 and the refractive index of the light-emitting layer 15 is further increased on the basis of the refractive index of the light-emitting layer 15. However, after repeating the experiments for many times, it is found that the difference therebetween cannot be expanded unlimitedly. When the difference between the refractive index of the hole transmission region 31 and the refractive index of the light-emitting layer 15 is greater than 0.3, the light extraction efficiency cannot be effectively improved. Therefore, in the present embodiment, the refractive index n3 of the hole transmission region 31 is set to satisfy: 1.8≤n3(λ=460 nm)≤1.9.

Figure 5:
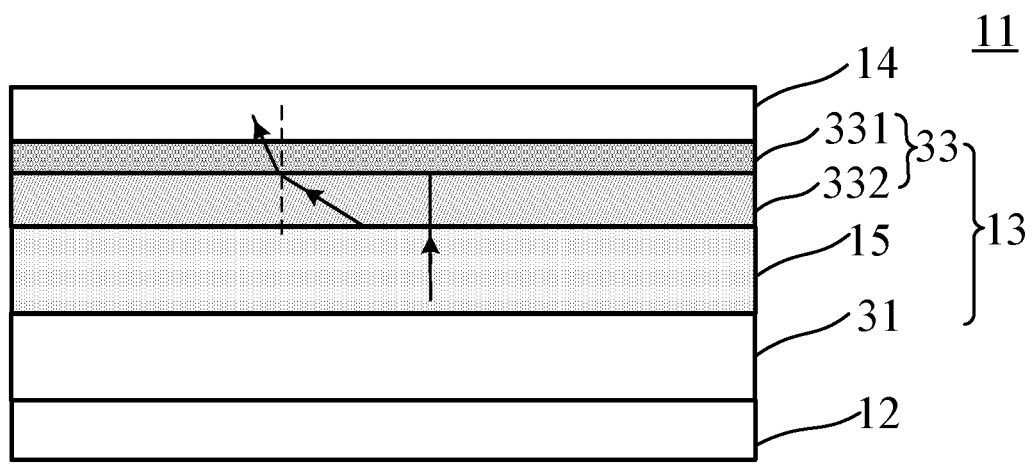
FIG. 5 is another cross-sectional view of an organic light-emitting component according to another embodiment of the present disclosure along AA' line in FIG. 3.

FIG. 5 is a cross-sectional view of an organic light emitting device at the AA' position shown in FIG. 3 according to another embodiment of the present disclosure. In this embodiment, the electron transmission region 33 includes a second electron transmission layer 332 and a first electron transmission layer 331 sequentially stacked from the light-emitting layer 15 to the cathode 14.

In addition, with respect to the visible light having a certain wavelength, a refractive index of the first electron transmission layer 331 is greater than or equal to a refractive index of the second electron transmission layer 332.

For example, in the present embodiment, the first electron transmission layer 331 can be lanthanide series metal Yb, which has a relatively low work function, so that the electrons can be easily injected into the first electron transmission layer 331 from the cathode 14.

The second electron transmission layer 332 can increase the electron transmission rate such that more electrons are transmitted from the cathode 14 to the light-emitting layer 15, thereby improving an efficiency of recombination of electrons and holes; or the second electron transmission layer 332 also can have a function of blocking holes, thereby inhibiting the migration of holes from the cathode 14 to the light-emitting layer 15, and avoiding a shift of the recombination center of electrons and holes.

In addition, the refractive index of the first electron transmission layer 331 close to the cathode 14 is greater than or equal to the refractive index of the second electron transmission layer 332. Therefore, when the light emitted from the light-emitting layer 15 gets into the first electron transmission layer 331 from the second electron transmission layer 332, the refraction angle is smaller than or equal to the incident angle, so that the light is prevented from getting into the region outside the organic light-emitting component 11, which would otherwise result in that the light cannot be extracted, thereby improving light extraction efficiency.

In a specific embodiment, with respect to the visible light having a wavelength of 460 nm, the refractive index n21 (λ=460 nm) of the first electron transmission layer 331, the refractive index n22 (λ=460 nm) of the second electron transmission layer 332 and the refractive index n1 (λ=460 nm) of the light-emitting layer 15 satisfy: n21(λ=460 nm)−n22(λ=460 nm)≥0.1; and n22(λ=460 nm)−n1(λ=460 nm)≥0.1.

Referring to FIG. 5, the refractive index n22 of the second electron transmission layer 332 is greater than the refractive index n1 of the light-emitting layer 15, and the refractive index n21 of the first electron transmission layer 331 is greater than the refractive index n22 of the second electron transmission layer 332. In a direction along which the light is emitted (from the light-emitting layer 15 to the cathode 14), with respect to the blue light having a wavelength of 460 nm, the refractive index is relatively increased, so that the light emitted by the light-emitting layer 15 gets into the optically dense medium from the optically thinner medium and the incident path of the light is changed to be closer to the normal direction, which is conductive to the light extraction.

Further, with respect to the visible light having a wavelength of 460 nm, the refractive index n21 (λ=460 nm) of the first electron transmission layer 331 and the refractive index n22 (λ=460 nm) of the second electron transmission layer 332 satisfy: 1.8≤n21(λ=460 nm)≤1.9; and 1.6≤n22(λ=460 nm)≤1.8.

In the present embodiment, in combination with the above embodiment, the above ranges of the refractive index of the first electron transmission layer 331 and the refractive index of the second electron transmission layer 332 are determined after repeating the experiments for several times. With respect to the blue light having a wavelength of 460 nm, the above ranges can allow the light emitted from the light-emitting layer 15 to be emitted close to the normal line, so as to prevent the light from getting into the region outside the organic light-emitting component 11, which would otherwise result in that the light cannot be extracted, thereby improving the light extraction efficiency.

Figure 6:
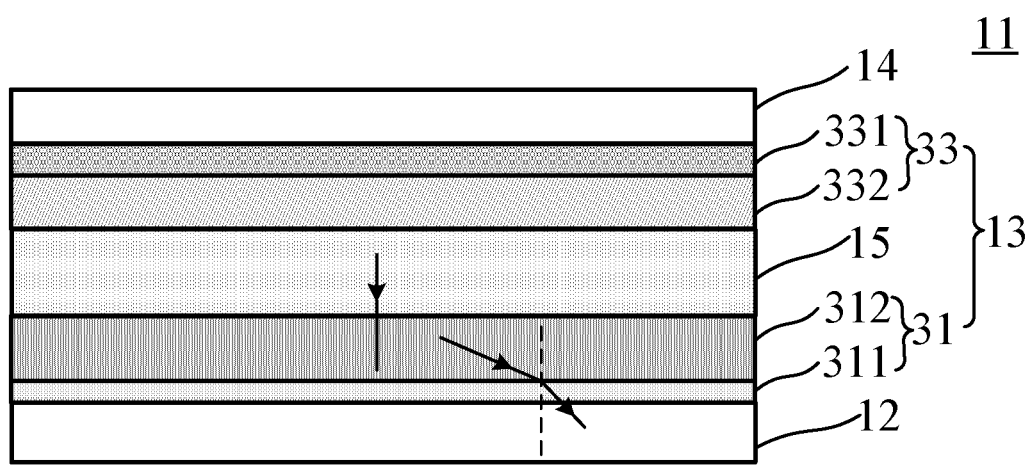
FIG. 6 is another cross-sectional view of an organic light-emitting component according to yet another embodiment of the present disclosure along AA' line in FIG. 3.

FIG. 6 is a cross-sectional view of an organic light-emitting component according to yet another embodiment of the present disclosure along AA' line in FIG. 3. In this embodiment, the electron transmission region 33 includes a first hole transmission layer 311 and a second hole transmission layer 312 sequentially stacked from the anode 12 to the light-emitting layer 15.

In addition, with respect to the visible light having a certain wavelength, a refractive index of the first hole transmission layer 311 is greater than or equal to a refractive index of the second hole transmission layer 312.

For example, the first hole transmission layer 311 in this embodiment can increase hole injection, so as to facilitate injecting holes generated by the anode 12 into the layer.

The second hole transmission layer 312 can transmit holes, which facilitates the migration of holes generated by the anode 12 into the light-emitting layer 15. It should be noted that a film thickness of the second hole transmission layer 312 can be adjusted according to the microcavity structure, so that an interference of the light emitted from the light-emitting layer 15 occurs, thereby improving the light extraction efficiency.

In addition, since the refractive index of the first hole transmission layer 311 is greater than or equal to the refractive index of the second hole transmission layer 312, when the light downwardly emitted from the light-emitting layer 15 gets into the first hole transmission layer 311 from the second hole transmission layer 312, the refraction angle is smaller than or equal to the incident angle, and the light is prevented from being emitted in a great angle, which would otherwise result in that the light cannot be extracted, thereby improving light extraction efficiency.

Further, with respect to the visible light having a wavelength of 460 nm, the refractive index n31 (λ=460 nm) of the first hole transmission layer 311, the refractive index n32 (λ=460 nm) of the second hole transmission layer 312 and the refractive index n1 (λ=460 nm) of the light-emitting layer 15 satisfy:

$$n31(\lambda=460\ nm)-n32(\lambda=460\ nm)\geq 0.1;\ and$$

$$n32(\lambda=460\ nm)-n1(\lambda=460\ nm)\geq 0.1.$$

Referring to FIG. 6, the refractive index n32 of the second hole transmission layer 312 is greater than the refractive index n1 of the light-emitting layer 15, and the refractive index n31 of the first hole transmission layer 311 is greater than the refractive index n32 of the second hole transmission layer 312. In a direction along which the light is emitted (from the light-emitting layer 15 to the anode 12), with respect to the blue light having a wavelength of 460 nm, the refractive index is relatively increased, so that the light emitted by the light-emitting layer 15 gets into the optically dense medium from the optically thinner medium and the incident path of the light is changed to be closer to the normal direction, which can prevent the light from being emitted in a great angle, which would otherwise result in that the light cannot be extracted.

Further, with respect to the visible light having a wavelength of 460 nm, the refractive index n31 (λ=460 nm) of the first hole transmission layer 311 and the refractive index n32 (λ=460 nm) of the second hole transmission layer 312 satisfy: 1.8≤n31(λ=460 nm)≤1.9; and 1.6≤n32(λ=460 nm)≤1.8.

The above ranges of the refractive index of the first hole transmission layer 311 and the refractive index of the second hole transmission layer 312 are determined after repeating the experiments for several times. With respect to the blue light having a wavelength of 460 nm, the above ranges ensure that the light emitted from the light-emitting layer 15 is emitted close to the normal line and the incident path way of the light is changed, so as to avoid that light is emitted in a great angle and thus cannot be extracted, thereby improving the light extraction efficiency.

In an embodiment, the host material of the light-emitting layer of the organic light-emitting component 11 includes a fluorine-containing group. The light-emitting layer including the fluorine-containing group has a relatively low refractive index, which satisfies the requirements of the refractive indices of the hole transmission region 31 and the electron transmission region 33, so that light gets into the optically dense medium from the optically thinner medium, which is conductive to emitting light close to the normal direction.

Figure 7:
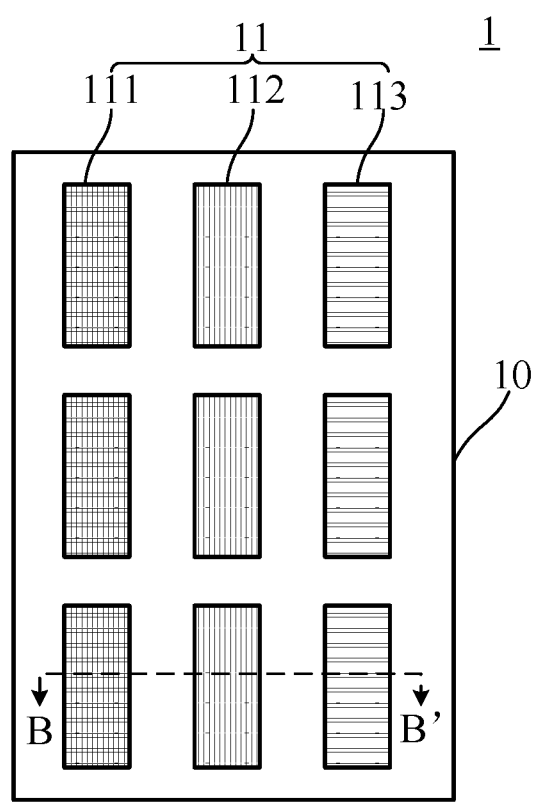
FIG. 7 is yet another schematic structural diagram of an organic light-emitting display panel according to an embodiment of the present disclosure.
Figure 8:
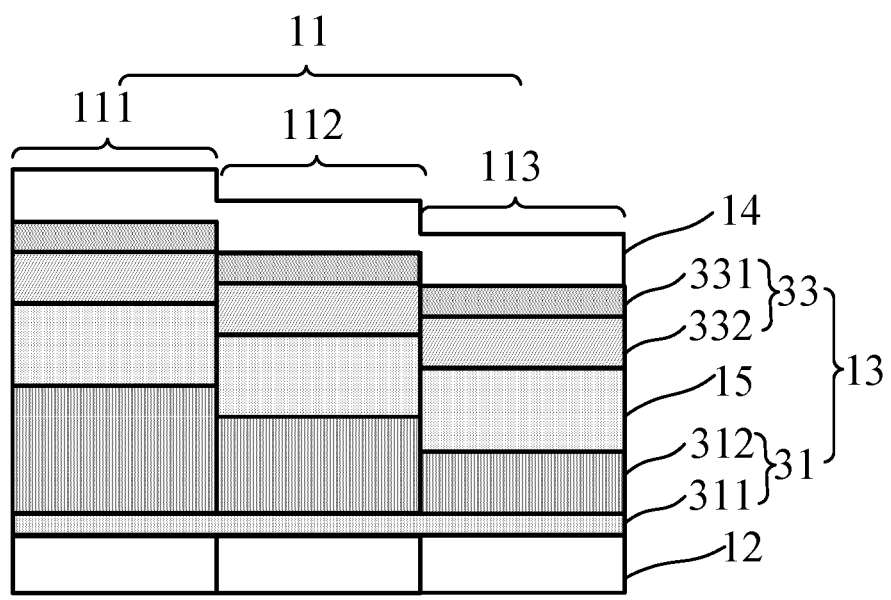
FIG. 8 is a cross-sectional view of an organic light-emitting component according to an embodiment of the present disclosure at BB' line shown in FIG. 7.

FIG. 7 is yet another schematic structural diagram of an organic light-emitting display panel according to an embodiment of the present disclosure, and FIG. 8 is a cross-sectional view of an organic light-emitting component according to an embodiment of the present disclosure at BB' line shown in FIG. 7. In this embodiment, the organic light-emitting component includes a red organic light-emitting component 111, a green organic light-emitting component 112 and a blue organic light-emitting component 113.

In this embodiment, the red light-emitting component 111 emits red light, the green light-emitting component 112 emits green light, and the blue light-emitting component 113 emits blue light. Since these three light colors correspond to light having different wavelengths, the organic light-emitting components emitting three colored light have different film thicknesses to achieve the microcavity effect of different colors. In this embodiment, in order to match the thickness of the respective film layers, the second hole transmission layer 312 can be used as a microcavity adjusting layer, and the thicknesses corresponding to microcavity structures of the organic light-emitting components emitting three colored light can be satisfied by adjusting the thickness of the microcavity adjusting layer.

The organic light-emitting components emitting three colored light have differentiated capabilities of hole transmission. In order to ensure that the recombination center of electrons and holes is in the light-emitting layer, the capability of hole transmission of the corresponding first hole transmission layer of the organic light-emitting components emitting three colored light can be adjusted correspondingly. In this way, the hole transmission efficiency can be improved on the one hand, and the shift of the recombination centers of electrons and holes can be avoided on the other hand.

Further, a refractive index to light having a wavelength of 620 nm of the light-emitting layer of the red organic light-emitting component 111 is equal to or less than a refractive index to light having a wavelength of 550 nm of the light-emitting layer of the green organic light-emitting component 112; or, the refractive index to light having a wavelength of 620 nm of the light-emitting layer of the red organic light-emitting component 111 is equal to or less than a refractive index to light having a wavelength of 460 nm of the light-emitting layer of the blue organic light-emitting component 113.

Figure 9:
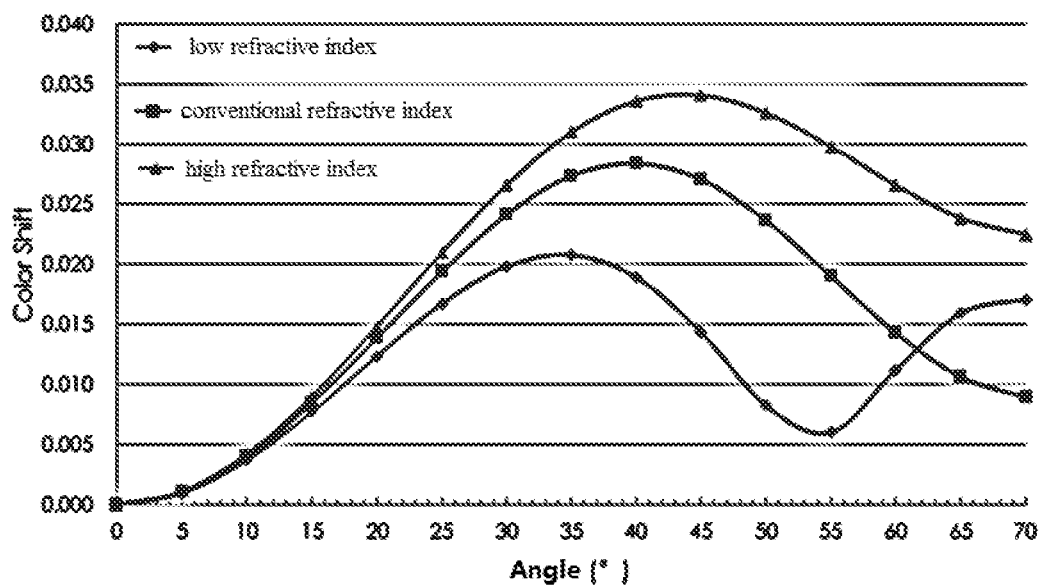
FIG. 9 is a viewing angle vs. refractive index curve of a blue organic light-emitting component.
Figure 10:
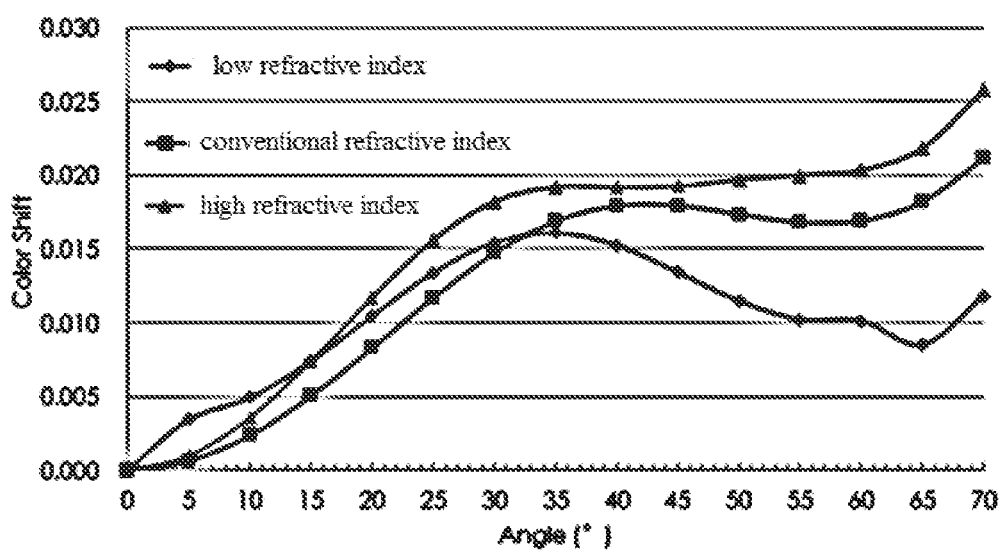
FIG. 10 is a viewing angle vs. refractive index curve of a green organic light-emitting component.

FIG. 9 is a viewing angle vs. refractive index curve of a blue organic light-emitting component, and FIG. 10 is a viewing angle vs. refractive index curve of a green organic light-emitting component. As shown in FIG. 9 and FIG. 10, with respect to a same color, the color shift of viewing angle of low refractive index curve is obviously improved.

In this embodiment, the color shift of viewing angle can be improved by adjusting the refractive index of the light-emitting layer of the organic light-emitting component. Further, when the organic light-emitting components emitting three colored light have different color shifts, the refractive index of the light-emitting layer of the organic light-emitting component can be specifically adjusted according the color of the light emitted by the light-emitting component.

For example, in the present embodiment, the light-emitting layer of the red organic light-emitting component 111 has a minimum refractive index to light having a wavelength of 620 nm, so as to ensure that the organic light-emitting components emitting three colored light have a basically same color shift and improve the light extraction efficiency of the red organic light emitting component.

Further, the refractive index to light having a wavelength of 460 nm of the light-emitting layer of the blue organic light-emitting component 113 is equal to or less than the refractive index to light having a wavelength of 550 nm of the light-emitting layer of the green organic light-emitting component 112.

In the present embodiment, when the color shift of the blue organic light-emitting component 113 is severe with respect to the green organic light-emitting component 112, the refractive index of the light-emitting layer of the blue organic light-emitting component 113 can be reduced. In this way, on the one hand, the color shift of the blue organic light-emitting component 113 can be alleviated, and on the other hand, the light extraction efficiency of the blue organic light emitting component can be improved.

Figure 11:
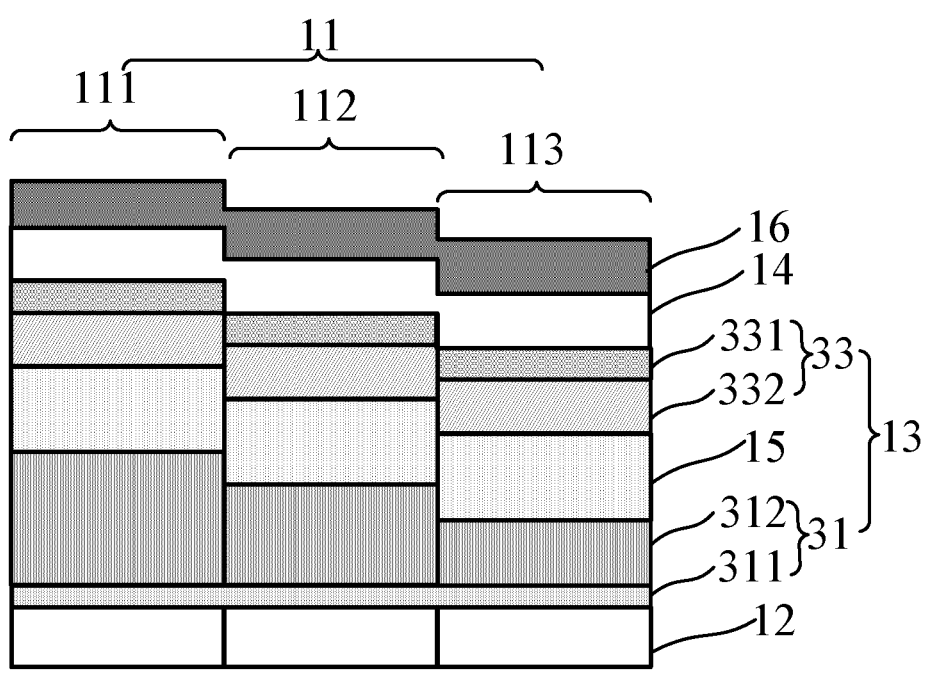
FIG. 11 is another cross-sectional view of an organic light-emitting component according to an embodiment of the present disclosure at BB' line shown in FIG. 7.
Figure 12:
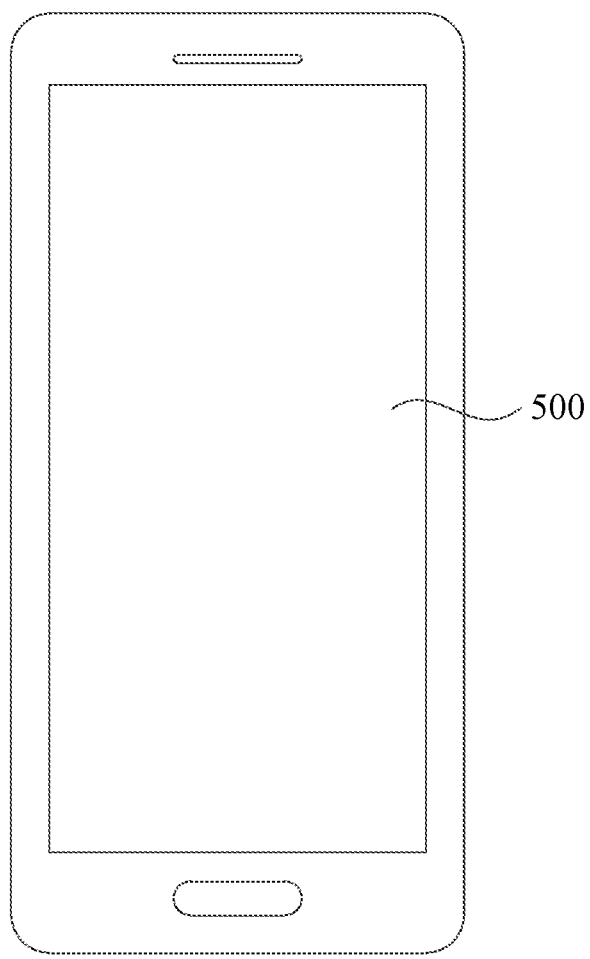
FIG. 12 is a schematic structural diagram of an organic light-emitting display device according to an embodiment of the present disclosure.

FIG. 11 is another cross-sectional view of an organic light-emitting component according to an embodiment of the present disclosure at BB' line shown in FIG. 7. In this embodiment, the organic light-emitting display panel 1 further includes a capping layer 16 disposed on a side of the cathode 14 facing away from the anode 12, and the capping layer 16 has a refractive index greater than that of the cathode 14.

Since the refractive index of the capping layer 16 is greater than the refractive index of the cathode 14, the light emitted from the light-emitting layer gets into the optically dense medium form the optically thinner medium, so that the refraction angle of the light is smaller than the incident angle, and the light is emitted closer to the normal direction, thereby improving the light emitting efficiency.

FIG. 10 is a schematic structural diagram of an organic light-emitting display device according to an embodiment of the present disclosure. The organic light-emitting display device 500 includes the organic light-emitting display panel 1 described above. It should be noted that, although a mobile phone is taken as an example in FIG. 10, the organic light-emitting display device is not limited thereto. Specifically, the organic light-emitting display device can include but not limited to an electronic device having display function such as personal computer (PC), personal digital assistant (PDA), wireless handhold device, tablet computer, MP4 player, television, or the like.

In the present embodiment, a part of the light generated by the light-emitting layer can be emitted upwardly in a direction perpendicular to the cathode, and another part of the light emitted obliquely upward is refracted at the interface between the light-emitting layer and the electron transmission region since the refractive index of the electron transmission region closer to the cathode is greater than the refractive index of the light-emitting layer. That is, light gets into an optically denser medium from an optically thinner medium, so that the light getting into the electron transmission region is emitted close to the normal direction, thereby increasing the amount of emitted light and further improving the light extraction efficiency. In addition, a part of the light generated by the light-emitting layer is emitted downwardly in a direction perpendicular to the cathode, and another part of the light emitted obliquely downward is refracted at the interface between the light-emitting layer and the hole transmission region since the refractive index of the hole transmission region away from the cathode is greater than the refractive index of the light-emitting layer. That is, light gets into an optically denser medium from an optically thinner medium, so that the light getting into the hole transmission region is emitted close to the normal direction. In this way, light can be prevented from getting into a region outside the organic light-emitting component, which would otherwise result in that the light cannot be extracted. Further, the emitted light is totally reflected by the anode in a small angle, which is conductive to improving the light extraction efficiency.

Finally, it should be noted that the above embodiments are used to illustrate, but not to limit the technical solutions of the present disclosure. Although the present disclosure is illustrated in detail with reference to the above embodiments, those skilled in the art can still modify the technical solutions recorded in the above embodiments, or equivalently replace part or all of the technical features. However, any modification or replacement will not lead to a derivation of the essence of the technical solutions from the scope of the embodiments the present disclosure.

What is claimed is:

1. An organic light-emitting display panel, comprising:
an array substrate, the array substrate comprising a plurality of driving elements; and
a plurality of organic light-emitting components corresponding to the plurality of driving elements,
wherein each of the plurality of light-emitting components comprises an anode, a cathode and an organic functional layer arranged between the anode and the cathode,
wherein the organic functional layer comprises a hole transmission region, a light-emitting layer, and an electron transmission region stacked in a sequence from the anode to the cathode, wherein the hole transmission region directly contacts the light-emitting layer,
wherein with respect to visible light having a wavelength, a refractive index of the light-emitting layer is less than a refractive index of the electron transmission region, and the refractive index of the light-emitting layer is less than a refractive index of each part of the hole transmission region,
wherein the electron transmission region comprises a first electron transmission layer and a second electron transmission layer, the second electron transmission layer and the first electron transmission layer being stacked in a sequence from the light-emitting layer to the cathode, and the hole transmission region comprises a first hole transmission layer and a second hole transmission layer stacked in a sequence from the anode to the light-emitting layer, and
wherein with respect to the visible light having a wavelength of 460 nm, the refractive index of the light-emitting layer is n1, a refractive index of the first electron transmission layer is n21, and a refractive index of the second electron transmission layer is n22, a refractive index of the first hole transmission layer is n31, and a refractive index of the second hole transmission layer is n32, where n21−n22>0.1, n22−n1>0.1, n31−n32>0.1 and n32−n1>0.1.

2. The organic light-emitting display panel according to claim 1, wherein with respect to the visible light having the wavelength of 460 nm, the refractive index of the hole transmission region is n3, where n3−n1>0.1.

3. The organic light-emitting display panel according to claim 2, wherein 1.45<n1<1.6.

4. The organic light-emitting display panel according to claim 2, wherein 1.6<n3<1.9.

5. The organic light-emitting display panel according to claim 2, wherein 1.8<n3<1.9.

6. The organic light-emitting display panel according to claim 1, wherein 1.8<n21<1.9 and 1.6<n22<1.8.

7. The organic light-emitting display panel according to claim 1, wherein the hole transmission region comprises a first hole transmission layer and a second hole transmission layer stacked in a sequence from the anode to the light-emitting layer; and
with respect to the visible light, a refractive index of the first hole transmission layer is greater than or equal to a refractive index of the second hole transmission layer.

8. The organic light-emitting display panel according to claim 1, wherein 1.8<n31<1.9 and 1.6<n32<1.8.

9. The organic light-emitting display panel according to claim 1, wherein a host material of the light-emitting layer of each of the plurality of organic light-emitting components comprises a fluorine-containing group.

10. The organic light-emitting display panel according to claim 1, wherein the organic light-emitting display panel further comprises a capping layer disposed on a side of the cathode facing away from the anode, and the capping layer has a refractive index greater than a refractive index of the cathode.

11. An organic light-emitting display device, comprising the organic light-emitting display panel according to claim 1.

12. An organic light-emitting display panel, comprising:
an array substrate, the array substrate comprising a plurality of driving elements; and
a plurality of organic light-emitting components corresponding to the plurality of driving elements, wherein the plurality of organic light-emitting components comprises a red organic light-emitting component configured to emit red light, a green organic light-emitting component configured to emit green light, and a blue organic light-emitting component configured to emit blue light,
wherein each of the plurality of light-emitting components comprises an anode, a cathode and an organic functional layer arranged between the anode and the cathode,
wherein the organic functional layer comprises a hole transmission region, a light-emitting layer, and an electron transmission region stacked in a sequence from the anode to the cathode, wherein the hole transmission region directly contacts the light-emitting layer,
wherein with respect to visible light having a wavelength, a refractive index of the light-emitting layer is less than a refractive index of the electron transmission region, and the refractive index of the light-emitting layer is less than a refractive index of each part of the hole transmission region, and
wherein in the array substrate, the refractive index of the light-emitting layer of the red organic light-emitting component for emitting light with the wavelength of 620 nm is equal to or less than the refractive index of the light-emitting layer of the blue organic light-emitting component for emitting light with the wavelength of 460 nm, so as to improve a color shift of viewing angle.

* * * * *